(12) United States Patent
Simpkins et al.

(10) Patent No.: US 12,710,318 B2
(45) Date of Patent: Aug. 18, 2026

(54) SENSOR NODE THERMAL MANAGEMENT AND ILLUMINATION

(71) Applicant: Dwellwell Analytics, Inc., Bethesda, MD (US)

(72) Inventors: Daniel Simpkins, Bethesda, MD (US); Charles Gritton, Sterling, VA (US); Darryl Harlan Ngai, Washington, DC (US); Friedrich G. Geck, Mount Airy, MD (US); Cynthia E. Cantrell, Hagerstown, MD (US)

(73) Assignee: Dwellwell Analytics, Inc., Bethesda, MD (US)

( * ) Notice: Subject to any disclaimer, the term of this patent is extended or adjusted under 35 U.S.C. 154(b) by 714 days.

(21) Appl. No.: 18/101,934

(22) Filed: Jan. 26, 2023

(65) Prior Publication Data

US 2023/0243706 A1 Aug. 3, 2023

Related U.S. Application Data

(60) Provisional application No. 63/305,070, filed on Jan. 31, 2022.

(51) Int. Cl.

| | |
|---|---|
| ***G01K 1/08*** | (2021.01) |
| ***G01K 1/20*** | (2006.01) |
| ***G01K 3/14*** | (2006.01) |
| ***G01K 7/42*** | (2006.01) |
| ***G01K 15/00*** | (2006.01) |
| ***H01R 24/66*** | (2011.01) |
| ***H05K 1/02*** | (2006.01) |
| ***H05K 1/14*** | (2006.01) |

(Continued)

(52) U.S. Cl.

CPC ................ *G01K 1/08* (2013.01); *G01K 1/20* (2013.01); *G01K 3/14* (2013.01); *G01K 7/42* (2013.01);

(Continued)

(58) Field of Classification Search

CPC .. G01K 1/08; G01K 1/20; G01K 3/14; G01K 7/42; G01K 15/005; G01K 2215/00;

(Continued)

(56) References Cited

U.S. PATENT DOCUMENTS 5,180,440 A * 1/1993 Siegel .................... G09B 19/24 29/829

5,870,284 A * 2/1999 Stewart ................ H05K 7/1092 361/756

(Continued)

OTHER PUBLICATIONS

Warren, M. et al., "Increased System Performance in Mobile Electronics Using Insulation-Graphite Composites" W.L. Gore & Associates, 2020 (12 pages).

(Continued)

*Primary Examiner* — Laura Martin
*Assistant Examiner* — Philip L Cotey
(74) *Attorney, Agent, or Firm* — Klintworth & Rozenblat LLP

(57) ABSTRACT

Example embodiments include an apparatus comprising a first printed circuit board (PCB) having an AC-DC power supply thereon and a second PCB having a processor thereon. The first and second BPBs are substantially parallel to one another. A first thermal barrier extends between the first and second PCB. The processor and the power supply are both on a first side of the first thermal barrier. A chamber on a second side of the first thermal barrier opposite the first side. The chamber is at least partly enclosed by a second thermal barrier and has at least one opening for fluid communication with an ambient environment. A temperature sensor is provided in the chamber. In some embodiments, an LED is provided on one of the PCBs, and a light-reflecting silkscreened pattern is provided on the PCB near the LED to increase light output of the apparatus.

20 Claims, 6 Drawing Sheets

(51) Int. Cl.
*H05K 7/20* (2006.01)
*H01R 24/68* (2011.01)

(52) U.S. Cl.
CPC .......... *G01K 15/005* (2013.01); *H01R 24/66* (2013.01); *H05K 1/0201* (2013.01); *H05K 1/0203* (2013.01); *H05K 1/0274* (2013.01); *H05K 1/14* (2013.01); *H05K 7/209* (2013.01); *G01K 2215/00* (2013.01); *H01R 24/68* (2013.01); *H05K 1/144* (2013.01); *H05K 2201/042* (2013.01); *H05K 2201/062* (2013.01); *H05K 2201/10106* (2013.01); *H05K 2201/10121* (2013.01)

(58) Field of Classification Search
CPC ...... H01R 24/66; H01R 24/68; H05K 1/0201; H05K 1/0203; H05K 1/0274; H05K 1/14; H05K 7/209; H05K 1/144; H05K 2201/042; H05K 2201/062; H05K 2201/10106; H05K 2201/10121
See application file for complete search history.

(56) References Cited

U.S. PATENT DOCUMENTS

| | | | | | |
|---|---|---|---|---|---|
| 2004/0223534 | A1* | 11/2004 | Trapp | G01K 1/20 | 374/E1.023 |
| 2011/0128991 | A1* | 6/2011 | Regensburger | G01K 1/20 | 374/208 |
| 2011/0170258 | A1* | 7/2011 | Single | B25F 5/008 | 361/752 |
| 2012/0092867 | A1* | 4/2012 | Kasper | H05K 1/02 | 257/E33.056 |
| 2015/0261266 | A1* | 9/2015 | Dean | H05K 7/20 | 361/679.46 |
| 2015/0319411 | A1* | 11/2015 | Kasmir | H04N 7/186 | 340/328 |
| 2017/0176260 | A1* | 6/2017 | Ferguson | G01K 7/16 | |
| 2017/0181271 | A1* | 6/2017 | Yee | H05K 1/0271 | |
| 2018/0049349 | A1* | 2/2018 | Voss | G06F 1/20 | |
| 2018/0132361 | A1* | 5/2018 | Mehkri | B23K 1/008 | |
| 2019/0357339 | A1* | 11/2019 | Kim | H05B 47/00 | |
| 2020/0085310 | A1* | 3/2020 | Zahner | G04G 17/00 | |
| 2021/0120706 | A1* | 4/2021 | Sato | G01K 7/01 | |
| 2021/0349485 | A1* | 11/2021 | Ng | G05D 23/1931 | |
| 2023/0087671 | A1* | 3/2023 | Telfort | A61B 5/01 | 600/549 |
| 2023/0098236 | A1* | 3/2023 | Tadele | G01K 7/427 | 374/29 |
| 2023/0099638 | A1* | 3/2023 | Clements | G01K 17/00 | 374/126 |
| 2023/0380075 | A1* | 11/2023 | Matsuda | H05K 3/303 | |

OTHER PUBLICATIONS

Gore Thermal Insulation “Turn up the Performance, Turn Down the Heat” Thermal Insulation: Enhanced Thermal Spreading for Mobile Devices W.L. Gore & Associates, Inc., 2021 (6 pages).

* cited by examiner 100
102
104
106
108

SENSOR NODE THERMAL MANAGEMENT AND ILLUMINATION

CROSS-REFERENCE TO RELATED APPLICATIONS

The present application claims benefit under 35 U.S.C. § 119(e) from U.S. Provisional Patent Application Ser. No. 63/305,070, entitled "Sensor Node Thermal Management and Illumination," filed Jan. 31, 2022, which is hereby incorporated by reference in its entirety.

BACKGROUND

The present disclosure relates to thermal management systems and methods for an electric or electronic device, such as a sensor node, that is engageable with an alternating current (AC) power outlet.

SUMMARY

Example embodiments include an apparatus comprising a first printed circuit board having an AC-DC power supply thereon and a second printed circuit board having a processor (such as a CPU, a microprocessor, an FPGA, ASIC, or other processing unit) thereon. The first and second printed circuit boards are substantially parallel to one another. A first thermal barrier extends between the first and second printed circuit boards. The processor and the power supply are both on a first side of the first thermal barrier. A chamber on a second side of the first thermal barrier opposite the first side. The chamber is at least partly enclosed by a second thermal barrier and has at least one opening for fluid communication with an ambient environment. A temperature sensor is provided in the chamber.

BRIEF DESCRIPTION OF THE DRAWINGS

FIG. 1A is a top view. FIG. 1B is a front view. FIG. 1C is a bottom view. FIG. 1D is a right side view. FIGS. 1E and 1F are front perspective views.

DETAILED DESCRIPTION

Figures 1A, 1B, 1C, 1D, 1E, 1F:
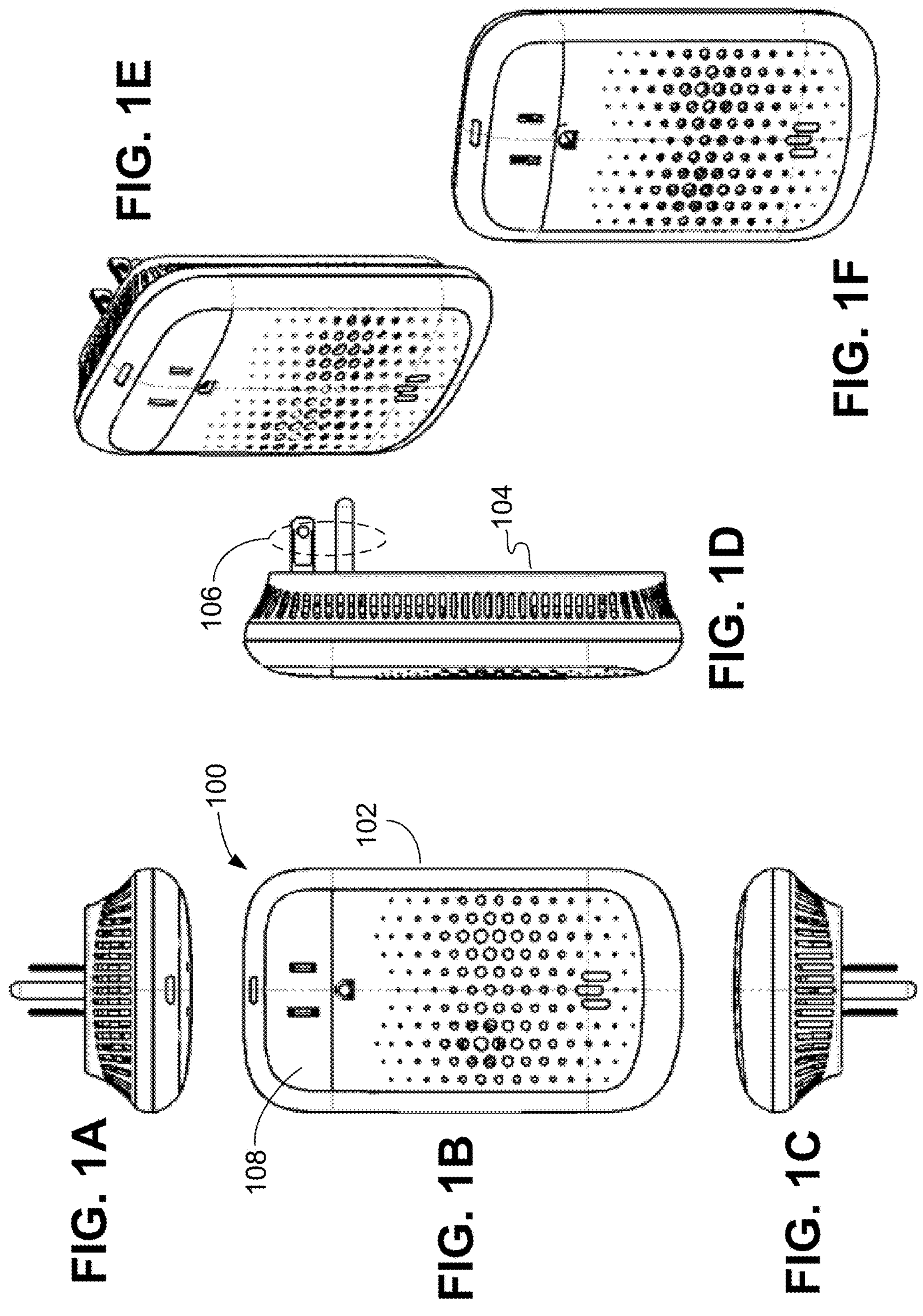
FIGS. 1A-1F are illustrations of a sensor node device that may be used in some embodiments.

As illustrated in FIGS. 1A-1F, a device 100 includes a housing 108 having a perimeter 102 and a rear surface 104. A set of power plug prongs 106 extends from the rear surface of the housing. Although the illustrated prongs are those compatible with standard North American outlets, other configurations may alternatively be used.

In some embodiments, the device 100 may be a sensor node enclosed in the housing 108. The sensor node may include one or more sensors such as an accelerometer or other orientation or movement sensor, a thermometer, a hygrometer, a light sensor, a microphone, or other sensors. The device 100 may further include a processor configured to process sensor reading and a wireless communications module to communicate raw or processed sensor data.

Thermal Management.

Example embodiments include a sensor device that has a temperature sensor to measure room temperature in a home or building. Some such embodiments utilize significant processing. Such embodiments include one or more approaches to thermal management to decrease the effects of heating due to power supply efficiency and heat generated by the processing, which may otherwise affect the accuracy of the temperature measurements.

Figure 2:
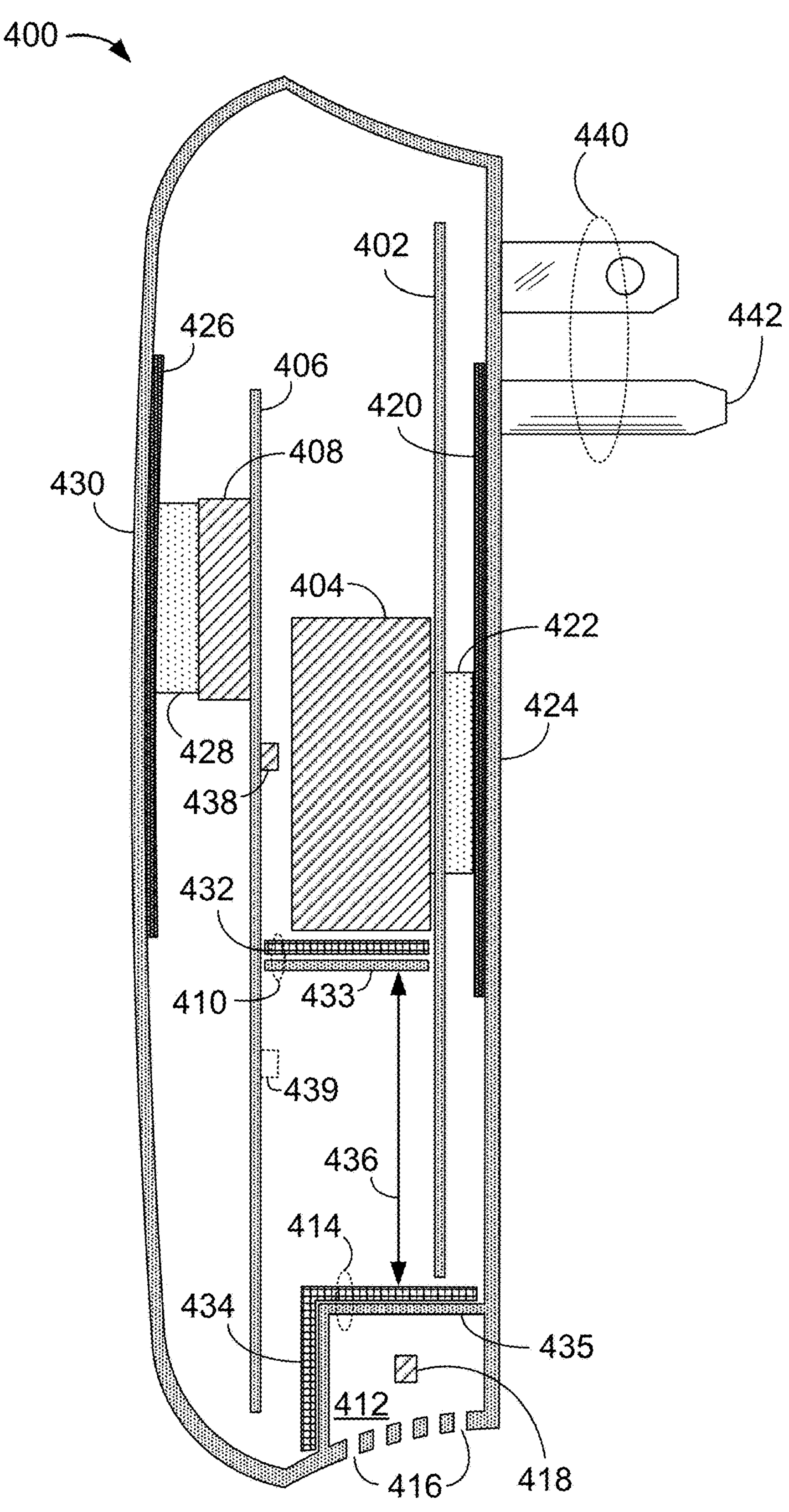
FIG. 2 is a schematic cross-sectional illustration showing thermal management features of the device of FIGS. 1A-1F according to some embodiments.
Figure 3:
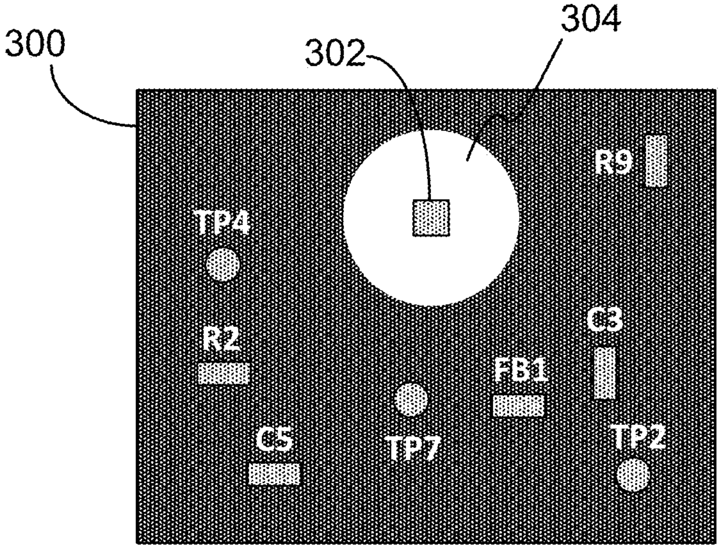
FIG. 3 is a top view of a printed circuit board using a silkscreened back reflector according to some embodiments.

In an example embodiment, as illustrated in FIGS. 2 and 3, the device includes two printed circuit boards (PCBs), a front PCB and a back PCB. The two PCBs may be arranged in planes that are substantially parallel to one another with a gap in between. The front PCB in this example has a processor as a main source of heat. The back PCB has an AC-DC power supply as a main source of heat. The device includes a temperature sensor at the bottom of the enclosure. The temperature sensor may be used to measure the temperature of the room in which the device is deployed. Due to internal heat generated by the processor and power supply it is beneficial to apply thermal management features as disclosed herein to reduce the effects of the generated heat on the measured temperature.

In order to reduce the effect of the processor heat spreading toward the temperature sensor, a thermal gap pad is used to transfer heat to a heat spreader, which may be but is not limited to a graphite heat spreader. In some embodiments, one or more of the heat spreaders may be a metallic foil such as aluminum. The heat spreader may be applied to the inside front housing with an adhesive.

In order to reduce the effect of the power supply heat spreading toward the temperature sensor, a thermal gap pad is used to transfer heat to a heat spreader, which may be a graphite heat spreader. The heat spreader may be applied to the inside of the back housing with an adhesive. In the embodiments of FIGS. 2 and 3, a hole (e.g. a rectangular hole) is provided through the PCB to make a good heat transfer path for the thermal gap pad.

In the illustrated embodiments, a wall is provided between the two PCBs to create thermal barrier that directs heat away from the temperature sensor. An insulation layer, such as a layer of expanded polytetrafluoroethylene (ePTFE) material may be provided on the wall. In some embodiments, the ePTFE layer encapsulates a silica aerogel material. The insulation layer may include a layer of Gore thermal insulation. In some embodiments, the insulation layer is provided on the side of the wall closest to the heat source(s).

In example embodiments, one or more walls are provided to the bottom area to create another barrier from the room temperature sensor. These walls may also be insulated with an insulation layer such as Gore thermal insulation. These walls may define a thermal isolation chamber in which a temperature sensor may be positioned. The thermal isolation chamber may have vents to allow air exchange with the ambient air.

The packing of a set of sensors and associated processor for data consolidation into a small space presents a few problems. Self-heating is one major problem, particularly where some of the environmental sensor readings can be impacted by the heat of the sensor device itself. Self-heating can affect more than just a temperature sensor. For example, the humidity and air pressure can change in response to temperature. The closer the temperature sensor reading is with the environment, the easier it is to calibrate.

Direct air flow may be useful in some embodiments for sensing ambient air conditions using sensors such as hygrometers and gas detectors. The effect can be nonlinear and affected by other properties such as airflow magnitude and direction around the apparatus.

In some embodiments, a method is used to calibrate sensors in a device to account for the self-heating.

Some embodiments use a wall with insulation next to the high heat generating sources to reduce the self-heating, making the calibration more accurate.

In some embodiments, multiple temperature sensors are used to improve accuracy. To more accurately determine the environmental temperature, it is desirable for different temperature sensors in the sensor apparatus to be placed at the extremes, closest to the outside ambient air and closest to the highest internal heat sources. It is desirable for the temperature sensors closest to the ambient air to be furthest away (thermally) from the internal heat sources. Temperature sensors may be placed throughout the sensor device to enable measurement of the influence of the air flow on the self-heating. For example, temperature sensors may be place near other temperature dependent sensors to properly calibrate them.

In some embodiments, the device tracks the history of influences, such as power failures, and different usage states of the device which change the self-heating magnitude.

One feature that allows for reduction of self-heating is to provide a higher thermal coupling to the environment. Some embodiments use a highly thermally conductive media (e.g. thermal gap fillers and graphite heat spreaders) to remove internal heat to outer surfaces). Even though plastics may have a low thermal conductivity, the outer walls of a plastic enclosure (e.g. ABS or PC-ABS) can be used to spread heat outward. The thin walls if connected to a hot internal surface do allow conduction of heat outward and convective cooling on the outer surface.

FIG. 2 is a schematic cross-sectional view of a sensor node apparatus 400 according to some embodiments. In the example of FIG. 2, the apparatus includes a first printed circuit board 402 having an AC-DC power supply 404 thereon. A second printed circuit board 406 has a processor 408 thereon. The first and second printed circuit boards may be substantially parallel to one another. A first thermal barrier 410 that may be substantially perpendicular to the first and second printed circuit boards extends between (i.e. across a gap between) the first and second printed circuit boards. The processor and the power supply are both on a first side of the first thermal barrier (above the thermal barrier, in the orientation of FIG. 2). A chamber 412, which may be referred to as a thermal isolation chamber, is provided on a second, opposite side of the first thermal barrier (below the thermal barrier, in the orientation of FIG. 2). The chamber is at least partly enclosed by a second thermal barrier 414 and has at least one opening or vent 416 for fluid communication (e.g. to allow the flow of air) with an ambient environment. A first temperature sensor 418 is provided in the chamber. In some embodiments, the first temperature sensor 418 is mounted at a position that is spaced from the second thermal barrier 414.

In some embodiments, a first heat spreader 420, which may be a graphite heat spreader, is coupled to the AC-DC power supply with a first thermal gap filler 422, the first heat spreader being applied (e.g. adhered) to a first housing surface 424. A second heat spreader 426, which may be a graphite heat spreader, is coupled to the processor with a second thermal gap filler 428, the second heat spreader being applied (e.g. adhered) to a second housing surface 430 substantially opposite the first housing surface. In some embodiments, one or more of the heat spreaders is coupled directly to the heat source (e.g. the processor or the power supply) without the use of a thermal gap filler.

In some embodiments, the first thermal barrier comprises a first insulation layer 432. The first insulation layer may be provided over a structural (e.g. plastic) wall 433. The second thermal barrier may include a second insulation layer 434. The second insulation layer may be provided over a structural (e.g. plastic) wall 435. The first and/or second insulation layers may be ePTFE insulation layers, which may be ePTFA layers encapsulating a silica aerogel material.

In some embodiments, the distance 436 between the second thermal barrier and the first thermal barrier is at least 10 mm. In some embodiments, the distance 436 is at least 20 mm. In some embodiments, the distance 436 is at least 30 mm. The separation between thermal barriers may provide additional insulation in the form of an air gap while allowing space in which additional components may be disposed, particularly components with minimal heat generation. In some embodiments, the space between the first and second thermal barriers is a ventilated space that allows air exchange with an ambient environment.

In some embodiments, the second thermal barrier is at least 20 mm from the processor and from the AC-DC power supply. In some embodiments, the second thermal barrier is at least 30 mm from the processor and from the AC-DC power supply.

In some embodiments, a second temperature sensor 438 is provided. The second temperature sensor is thermally more closely coupled to the processor and/or the power supply than the first temperature sensor. For example, in some embodiments, at least one of the thermal barriers does not separate the second temperature sensor from the processor and/or the power supply. The second temperature sensor may be on an opposite side of the second thermal barrier from the first temperature sensor. The second temperature sensor may also be on an opposite side of the first thermal barrier from the first temperature sensor. In some embodiments, neither of the thermal barriers separates the second temperature sensor from the processor and/or the power supply. The second temperature sensor may be on the second printed circuit board (as shown) or on the first printed circuit board. Alternatively or additionally, a temperature sensor may be positioned between the first and second thermal barriers as indicated by reference 439. The second temperature sensor may be used for correction of the readings of the first temperature sensor. For example, a temperature reading at the first temperature sensor may be adjusted downward in response to a high reading at the second temperature sensor. Such adjustment may provide a more accurate estimate of a temperature of the ambient environment by excluding the effect of heat generated from within the device. In some embodiments, the amount of adjustment may depend at least in part on the orientation of the device housing. For example, if the housing is oriented with the temperature sensor below the processor and/or the power supply, the amount of adjustment may be smaller than if the temperature sensor is toward the side of the processor and/or the power supply. In some embodiments, the device includes an accelerometer or other tilt sensor to determine the orientation automatically.

An adjustment based on the orientation (e.g. a linear or nonlinear function) may be applied to the sensed temperature. For example, the parameters of a function implementing the adjustment (e.g. an offset, slope, or other parameter) may differ for different orientations.

In the apparatus of FIG. 2, the device housing includes a set of power plug prongs 440 extending from a rear surface 424 of the housing. The set of power plug prongs includes a ground prong 442. The sensor chamber 412 is positioned in the housing such that ground prong is the nearest power plug prong to the sensor chamber (the line and neutral prongs being further away). In this arrangement, when the power plug prongs are plugged into a vertically-oriented electrical socket, the device is likely (given the orientation of the ground receptacle in most such electrical sockets) to have an orientation in which the sensor chamber is positioned below the set of power plug prongs. As a result, air heated by heat-generating components near the set of power plug prongs is likely to rise and thus travel away from the sensor chamber, having less of an effect on readings (e.g. temperature readings) taken in the chamber.

In some such embodiments, the temperature sensor is at least 40 mm from the ground prong. In some embodiments, the temperature sensor is at least 60 mm from the ground prong. In some embodiments, as in the example of FIG. 2, an AC-DC power supply is in the housing, the AC-DC power supply being between the sensor chamber and the ground prong or on the opposite side of the ground prong from the temperature sensor. In some embodiments, a processor is between the sensor chamber and the ground prong or on the opposite side of the ground prong from the temperature sensor.

Figure 5:
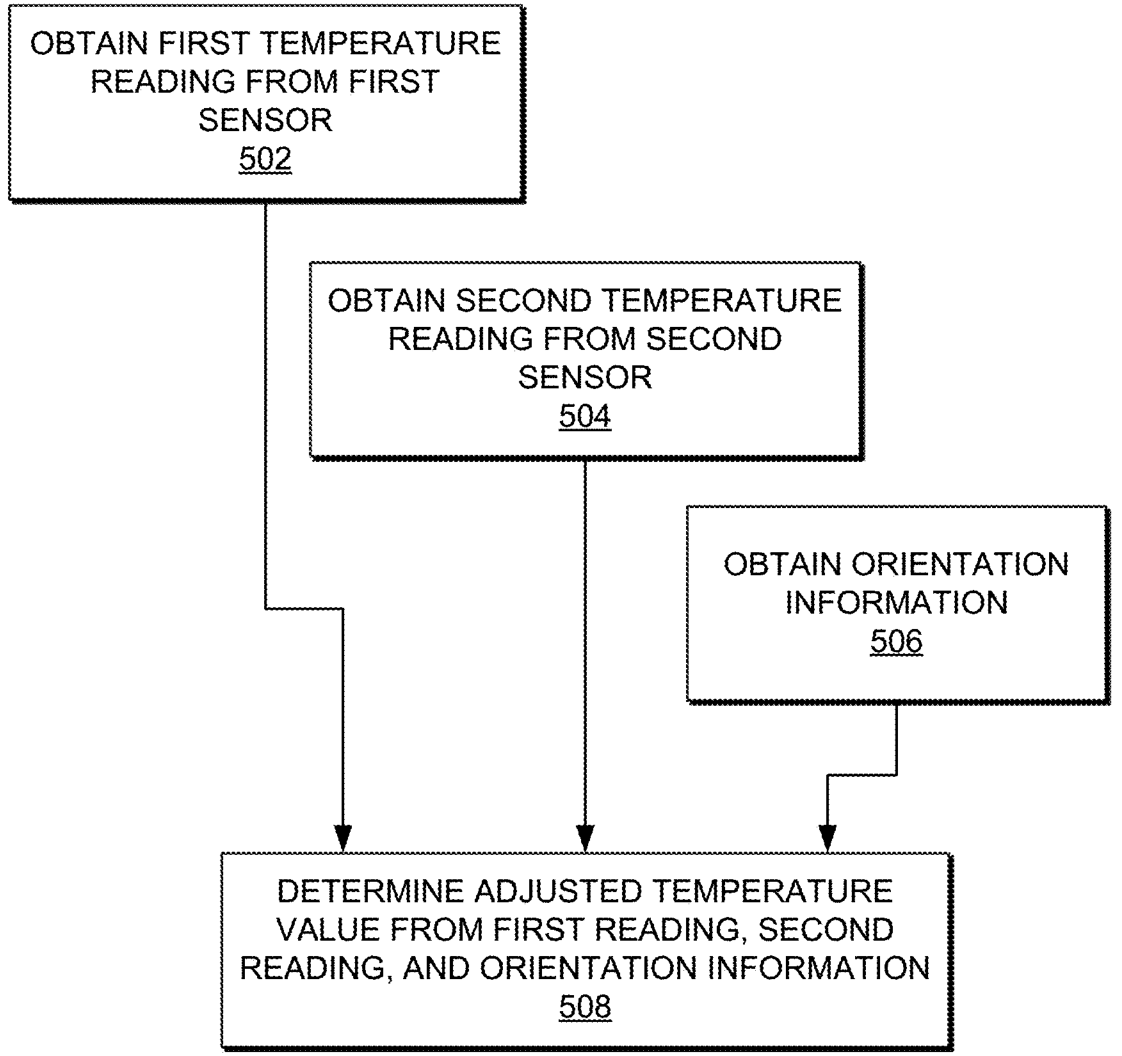
FIG. 5 is a flow diagram illustrating a temperature estimation method according to some embodiments.

A method of temperature calibration performed in some embodiments is illustrated in FIG. 5. At 502, a first temperature reading is obtained from a first temperature sensor. At 504, a second temperature reading is obtained from a second temperature sensor. The first temperature sensor may be a sensor such as temperature sensor 418 disposed in a multi-sensor sensor node apparatus such as apparatus 400. The second temperature sensor may be a sensor such as temperature sensor 438, disposed at a different position in the same sensor node apparatus 400. At 506, orientation information is obtained for the sensor node apparatus. The orientation information may be obtained through the use of one or more accelerometers in apparatus 400.

At 508, an adjusted temperature value is obtained based on the first temperature reading, the second temperature reading, and the orientation information. In some embodiments, the adjustment may be made to provide an estimate of an ambient temperature (e.g. the temperature in a room) by calibrating for heat generated by the sensor node itself. For example, where the sensor node contains heat-generating components such as a processor and/or an AC/DC power supply, the second temperature sensor may be placed nearer to the heat generating components than the first sensor. In some embodiments, one or more thermal barriers may be arranged between the first sensor and the second sensor, such as barriers 410 and 414. In this case, if the second temperature sensor is providing a higher reading than the first temperature sensor, this may indicate that heat is being generated by the heat-generating component(s). To compensate for this heat, the adjusted temperature value may be obtained by lowering the first temperature reading to obtain an estimate of what the first temperature sensor would be reading in the absence of heat generated by the sensor node itself. In some cases, the amount by which the first temperature reading is lowered is based at least in part on the temperature difference between the first and second readings, with a greater temperature difference leading to a greater adjustment.

In some embodiments, the amount by which the first temperature reading is lowered is based at least in part on the orientation information, The orientation information may indicate whether the first temperature sensor is generally above, below, or to the side of the second temperature sensor and/or the heat-generating component(s). Precise orientation information is not needed for some embodiments. The adjustment to first temperature reading may be greater if the orientation information indicates that the first temperature sensor is above the heat-generating component(s), as the heat from such components is more likely to convect upward toward the first temperature sensor. Conversely, the adjustment to first temperature reading may be lower if the orientation information indicates that the first temperature sensor is below or to the side of the heat-generating component(s), as the heat from such components is less likely to convect toward the first temperature sensor (although radiant and conductive heat transmission may still affect the first temperature sensor).

While some example principles are described here for determining an adjusted temperature value, in some embodiments, the determination of the adjusted temperature is made without express reliance on any assumptions regarding heat transfer. For example, experiments may be conducted to obtain readings from sensor node 400 using different room arrangements, different sensor orientations, different ambient temperatures, and different operating conditions (e.g. low use versus heavy use of the processor), and these readings from the sensor node may be compared with temperature readings elsewhere in the room. With such data, an appropriate lookup table, line, curve, or other equation may be selected that provides a good fit with the temperature readings elsewhere in the room. It may be found through such experimentation that a good fit can be obtained without regard to the sensor orientation, thus in some embodiments, the sensor orientation is not used in determining the adjusted temperature.

Illumination Efficiency.

Additional embodiments described herein relate to improving illumination from a light source (e.g. an LED) on a printed circuit board.

Some of the energy radiated by some PCB-mounted LEDs hits the PCB first and then is reflected out to the viewer. Standard PCBs are often a green, red, blue, or black color that can diminish the viewing quality of the light emitted by the LED, alter its apparent color, and/or reduce its perceived intensity.

In some embodiments, the standard silkscreen coating used on PCBs to identify components and manufacturing information is printed in a wide area immediately around the LED to be enhanced. Light escaping from the sides of the LED, or reflected back from the inside of case, is likely to be reflected by the white silkscreen reflector in the example above.

Example embodiments provide a relatively reflective area of silkscreen coating around the LED to increase the amount of light that is reflected toward the viewer. On many boards, a silkscreen is already part of the board fabrication process, so the effect on manufacturing costs may be negligible.

Some embodiments use a white silkscreen, which may be desirable for reflecting all colors, such as those emitted by tri-color LEDs. However, for single-color LEDs, a color closer to the LED's may be chosen, such as a yellow silkscreen for a yellow LED.

Embodiments as disclosed herein help to standardize the background color beneath the LED so that radiated color to the customer is closer to that intended.

Such embodiments may further increase the apparent intensity of the LED providing a larger dynamic range as seen by a user. Conversely, such embodiments may allow a reduction of power to the LED for the same apparent viewing intensity.

FIG. 3 is a top view of a printed circuit board 300 (e.g. a green printed circuit board) on which an LED 302 is mounted. According to one embodiment, a white silkscreen coating 304 provides a solid white circular area centered on the LED 302. In some embodiments, the same silkscreen coating is used to print reference designators for other electronic components on the board 300, such as designators for test points TP2, TP4, and TP7, resistors R2 and R9, capacitors C3 and C5, and ferrite bead FEM.

As opposed to silkscreen printing on a printed circuit board that only incidentally reflects emitted light, the present disclosure envisions a greater proportion of the PCB area near the LED being covered with the silkscreen coating.

Figure 4:
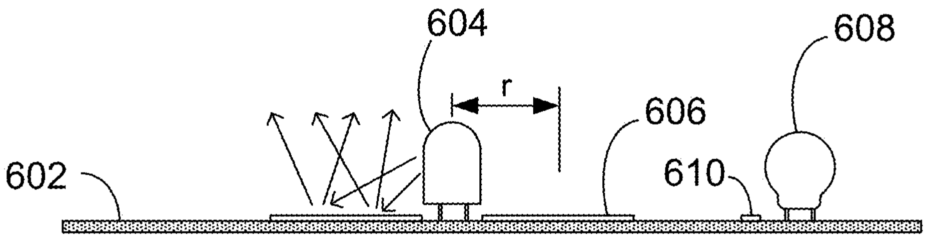
FIG. 4 is a schematic side view of a printed circuit board using a silkscreened back reflector according to some embodiments.

In an example as illustrated in FIG. 4, a printed circuit board 602 has a light-emitting component 604 mounted thereon. A silkscreen pattern 606 is provided on the printed circuit board. The pattern is configured such that, within a desired distance r from a center of the light-emitting component, a silkscreened coating is provided over at least 50% of the region. For example, where r=5 mm, in a region less than 5 mm from a center of the light-emitting component, a silkscreened coating is provided over at least 50% of the region. The silkscreened coating may extend beyond the selected distance r, e.g. it may extend beyond 5 mm, and the pattern itself does not necessarily form a circle. In some embodiments, the silkscreened coating is provided over at least 75% of the region. The silkscreened coating within the region near the light-emitting component may be a solid coating region, it may be a stippled pattern, or it may have other configurations.

In some embodiments, r=10 mm, and the pattern is configured such that, within a region less than 10 mm from a center of the light-emitting component, a silkscreened coating is provided over at least 50% of the region. In some embodiments, the silkscreened coating is provided over at least 75% of the region.

In some embodiments, the printed circuit board further includes a plurality of non-light-emitting components thereon, such as component 608. The silkscreen pattern may further include indicia identifying at least some of the non-light-emitting components. In a manufacturing method, the coating surrounding the LED is applied to the printed circuit board in the same printing step as the application of the coating representing the indicia. In some embodiments, the coating surrounding the LED may be cured (e.g. using UV curing) in the same printing step as the curing of the coating representing the indicia.

In some embodiments, the silkscreened coating covers no more than 50% of the surface of the PCB on which the light source is applied. In some embodiments, the silkscreened coating covers no more than 75% of the surface of the PCB on which the light source is applied.

Example System Hardware.

Figure 6:
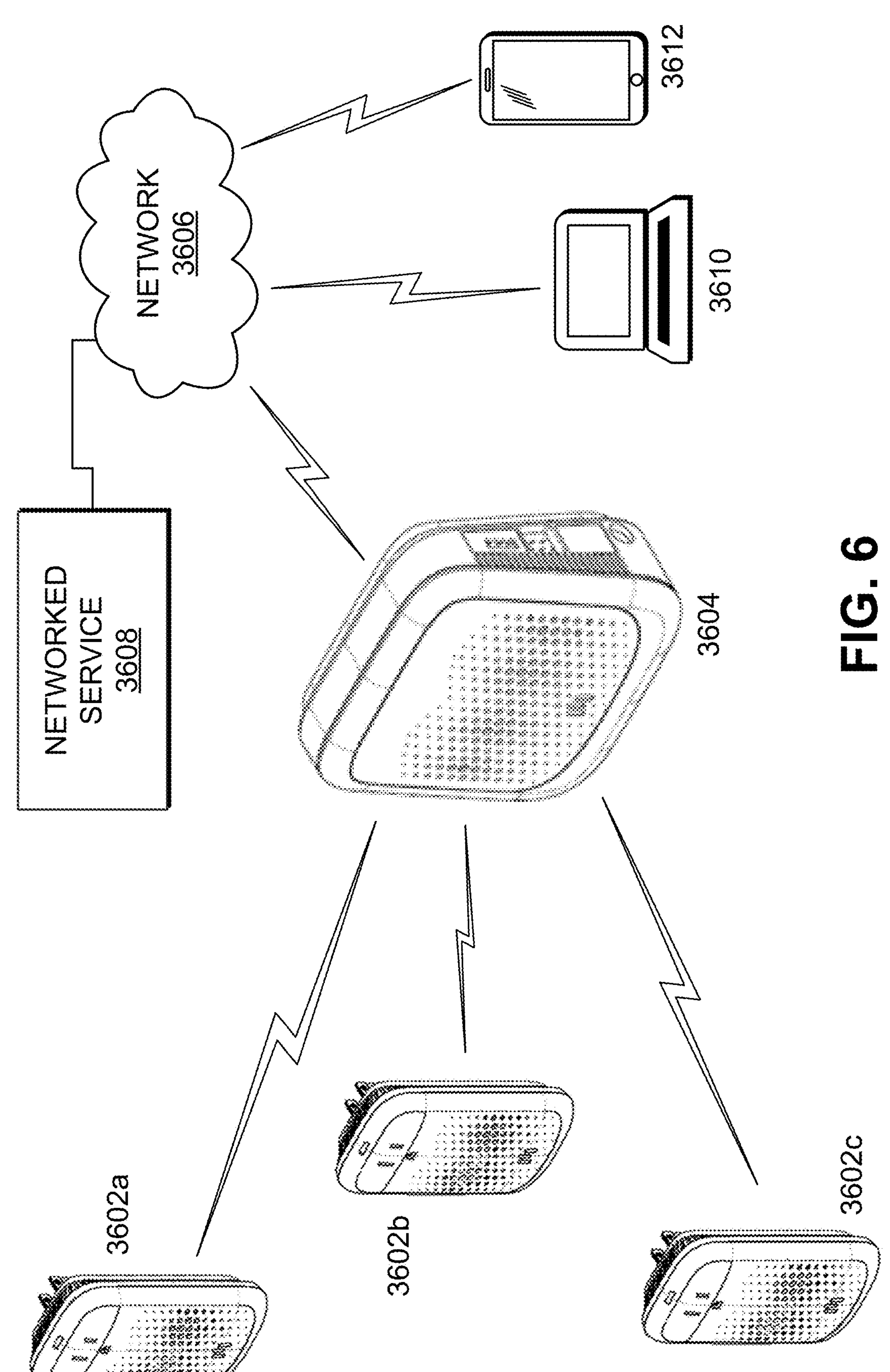
FIG. 6 schematically illustrates a sensor system architecture used in some embodiments.

FIG. 6 schematically illustrates network topology used in some embodiments. One or more sensor nodes 3602*a-c* may be disposed in a residence, e.g. in different rooms. Each node may be plugged in to an electrical outlet. The sensor nodes are in wireless communication with a hub node 3604, e.g. using a WiFi connection or other local area network. The hub node 3604 may further have a connection to a wide-area network 3606 such as the internet through which a networked service 3608 running on one or more servers, such as a cloud service, may be accessed. Users may have personal devices such as a computer 3610 or mobile computing device 3612 that can also access the networked service 3608 over the network 3606. In some embodiments, the user interfaces described herein are displayed when the user accesses the networked service on their personal device. In some embodiments, the user's personal devices may be capable of communicating directly with the hub node 3604 and/or with the sensor nodes 3602*a-c* to view the user interfaces or to exchange other information. In some embodiments, the sensor nodes 3602*a-c* may be capable of communicating over the network 3606 without the intermediation of the hub node (e.g. through a router).

Figure 7:
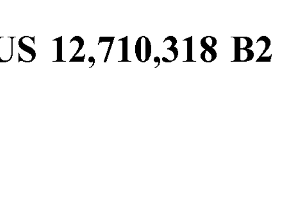
FIG. 7 is a functional block diagram schematically illustrating an example computational architecture of a sensor node used in some embodiments.
Figure 7:
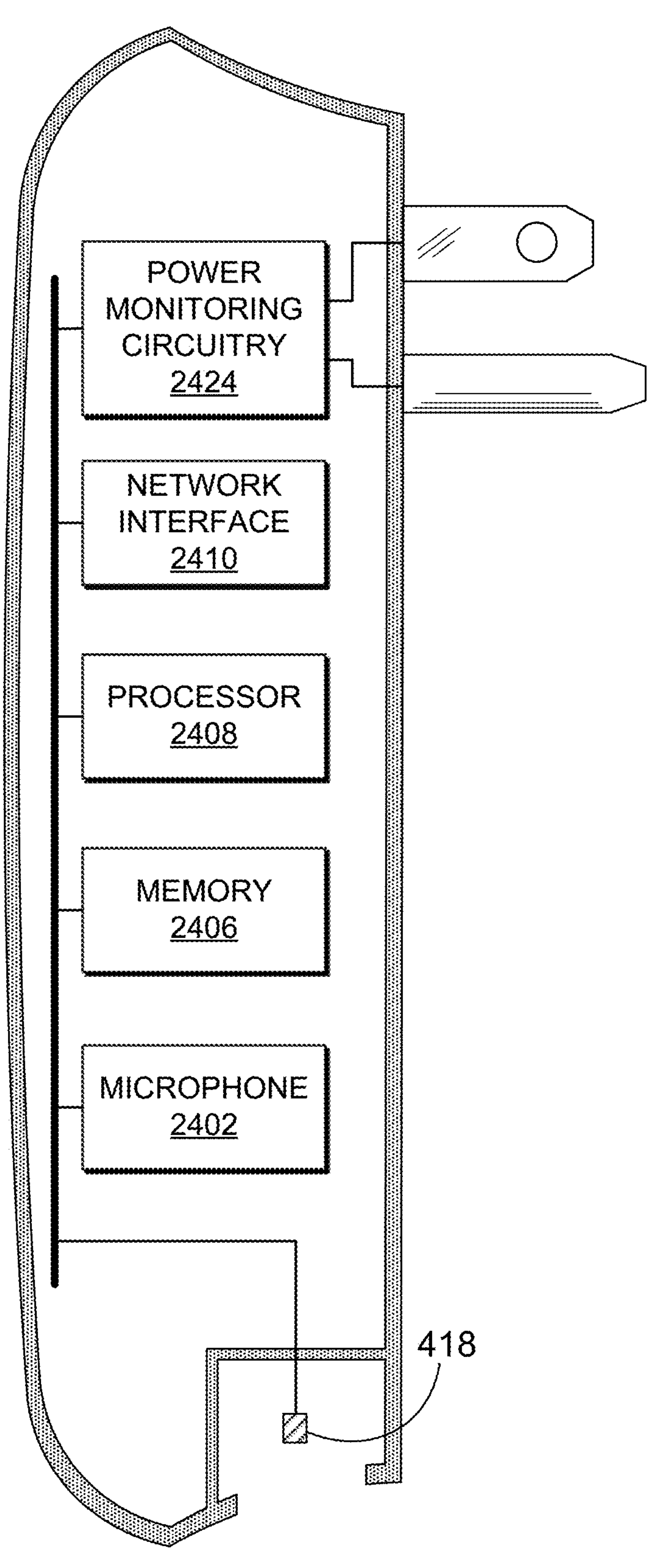

In example embodiments, as shown in FIG. 7, the sensor node in some embodiments includes one or more temperature sensors 418 in communication (e.g. over a bus or other internal connection) with a processor 2408. The sensor node may also include one or more sensors of other modalities, such as a microphone 2402 and/or power monitoring circuitry 2424. The sensor node further includes a memory 2406, which may include a non-transitory memory. The memory may store collected data (e.g. temperature and audio data). The memory may further store instructions that are executable by the processor for causing the processor to perform any of the methods described herein. A network interface 2410 may be provided to allow for communication with hub devices, other sensor nodes, or other equipment.

The hub node likewise includes a memory, which may include a non-transitory memory, a processor, and one or more network interfaces for connection (e.g. a wireless connection) with the sensor nodes and with the internet (possibly through a router). The memory may store collected data (e.g. temperature and orientation data) received from one or more sensor nodes. The memory may further store instructions that are executable by the processor for causing the processor to perform any of the methods described herein.

Any feature described herein as a module may be implemented with structures including, but not limited to, one or more processors and at least one storage medium (e.g. a non-transitory storage medium) storing instructions that are operative, when executed on the one or more processors, to perform any functions associated with the module. Such a module may further include any appropriate environmental sensors (e.g. a thermometer, hygrometer, microphone) or input or output devices (e.g. screens, keyboards, network interfaces) used to implement the functions associated with the module. In some embodiments, computing operations may be implemented by circuitry other than a processor, such as by a field-programmable gate array (FPGA) or other logic circuitry. The componentry used to implement a module may in some embodiments be distributed among different physical devices that communicate with one another to perform the associated functions.

Additional Embodiments

An apparatus according to some embodiments includes a first printed circuit board having an AC-DC power supply thereon; a second printed circuit board having a processor thereon, the first and second printed circuit boards being substantially parallel to one another; a first thermal barrier extending between the first and second printed circuit boards, the processor and the power supply both being on a first side of the first thermal barrier; a chamber on a second side of the first thermal barrier, the chamber being at least partly enclosed by a second thermal barrier and having at least one opening for fluid communication with an ambient environment; and a first temperature sensor in the chamber.

In some embodiments, such an apparatus further includes a first heat spreader coupled to the AC-DC power supply with a first thermal gap filler, the first heat spreader being applied to a first housing surface; and a second heat spreader coupled to the processor with a second thermal gap filler, the second heat spreader being applied to a second housing surface substantially opposite the first housing surface.

In some embodiments, the first thermal barrier comprises a first insulation layer and the second thermal barrier comprises a second insulation layer.

In some embodiments, the first thermal barrier comprises a first ePTFE insulation layer and the second thermal barrier comprises a second ePTFE insulation layer.

In some embodiments, the second thermal barrier is at least 20 mm from the first thermal barrier.

In some embodiments, the second thermal barrier is at least 30 mm from the processor and from the AC-DC power supply.

Some embodiments further include a second temperature sensor between the first thermal barrier and the second thermal barrier.

An apparatus according to some embodiments includes a housing having a set of power plug prongs extending from a rear surface thereof, the set of power plug prongs including a ground prong; a sensor chamber in the housing, the chamber being at least partly enclosed by a thermal barrier and having at least one opening for fluid communication with an ambient environment; and a temperature sensor in the sensor chamber; wherein the sensor chamber is positioned in the housing such that ground prong is the nearest power plug prong to the sensor chamber.

In some such embodiments, the temperature sensor is at least 60 mm from the ground prong.

Some embodiments further include an AC-DC power supply in the housing, the AC-DC power supply being between the sensor chamber and the ground prong.

Some embodiments further include a processor in the housing, the processor being between the sensor chamber and the ground prong.

An apparatus according to some embodiments includes a printed circuit board having a light-emitting component mounted thereon, and a silkscreen pattern on the printed circuit board, wherein the pattern is configured such that, within a region less than 5 mm from a center of the light-emitting component, a silkscreened coating is provided over at least 50% of the region.

An apparatus according to some embodiments includes a printed circuit board having a light-emitting component mounted thereon; and a silkscreen pattern on the printed circuit board, wherein the pattern is configured such that, within a region less than 10 mm from a center of the light-emitting component, a silkscreened coating is provided over at least 50% of the region.

In some such embodiments, the silkscreened coating is provided over at least 75% of the region.

In some embodiments, the silkscreened coating is a white coating.

In some embodiments, the light-emitting component is an LED.

In some embodiments, the light-emitting component emits light having a color, and the silkscreened coating is a color corresponding to (e.g. substantially the same as) the emitted light.

In some embodiments, the printed circuit board further includes a plurality of non-light-emitting components thereon, and the silkscreen pattern further includes indicia identifying at least some of the non-light-emitting components. In some embodiments, the same color is used for the indicia and for the region surrounding the light-emitting components.

An apparatus according to some embodiments includes a housing; at least one heat source in the housing, at least one of the heat sources being a processor or an AC-DC power supply; a thermal spreader coupled to the heat source and to the housing; a chamber in the housing, the chamber being separated from the heat source by at least one first thermal barrier and having at least one opening for fluid communication with an ambient environment; and a temperature sensor in the chamber.

As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Other variations of the described embodiments are contemplated. The above-described embodiments are intended to be illustrative, rather than restrictive, of the present invention. The scope of the invention is thus not limited by the examples given above but rather is defined by the following claims.

The invention claimed is:

1. An apparatus comprising:

a first printed circuit board having an AC-DC power supply thereon;

a second printed circuit board having a processor thereon, the first and second printed circuit boards being substantially parallel to one another;

a first thermal barrier extending between the first and second printed circuit boards, the processor and the power supply both being on a first side of the first thermal barrier;

a chamber on a second side of the first thermal barrier, the chamber being at least partly enclosed by a second thermal barrier and having at least one opening allowing air flow with an ambient environment; and a first temperature sensor in the chamber.

2. The apparatus of claim 1, further comprising:

a first heat spreader coupled to the AC-DC power supply with a first thermal gap filler, the first heat spreader being applied to a first housing surface; and a second heat spreader coupled to the processor with a second thermal gap filler, the second heat spreader being applied to a second housing surface substantially opposite the first housing surface.

3. The apparatus of claim 1, wherein the first thermal barrier comprises a first insulation layer and the second thermal barrier comprises a second insulation layer.

4. The apparatus of claim 1, wherein the first thermal barrier comprises a first ePTFE insulation layer and the second thermal barrier comprises a second ePTFE insulation layer.

5. The apparatus of claim 1, wherein the second thermal barrier is at least 20 mm from the first thermal barrier.

6. The apparatus of claim 1, wherein the second thermal barrier is at least 30 mm from the processor and from the AC-DC power supply.

7. The apparatus of claim 1, further comprising a second temperature sensor, the second temperature sensor being on an opposite side of at least the second thermal barrier from the first temperature sensor.

8. The apparatus of claim 1, wherein at least one of the printed circuit boards has a light-emitting component mounted thereon, and a light-reflecting silkscreen pattern is provided on the printed circuit board around the light-emitting component.

9. The apparatus of claim 1, further comprising:

a housing having a set of power plug prongs extending from a rear surface thereof, the set of power plug prongs including a ground prong;

wherein the chamber is positioned in the housing such that ground prong is the nearest power plug prong to the chamber.

10. The apparatus of claim 9, wherein the first temperature sensor is at least 60 mm from the ground prong.

11. The apparatus of claim 9, wherein the AC-DC power supply is between the chamber and the ground prong.

12. The apparatus of claim 9, wherein the processor is between the sensor chamber and the ground prong.

13. An apparatus comprising:

a first printed circuit board having an AC-DC power supply thereon;

a second printed circuit board having a processor thereon, the first and second printed circuit boards being substantially parallel to one another;

a first thermal barrier formed by a wall extending across a gap between the first and second printed circuit boards, the processor and the power supply both being on a first side of the wall forming the first thermal barrier;

a chamber on a second side of the wall forming the first thermal barrier, the chamber being at least partly enclosed by a second thermal barrier and having at least one opening allowing air flow with an ambient environment; and a first temperature sensor in the chamber.

14. The apparatus of claim 13, further comprising:

a first heat spreader coupled to the AC-DC power supply with a first thermal gap filler, the first heat spreader being applied to a first housing surface; and a second heat spreader coupled to the processor with a second thermal gap filler, the second heat spreader being applied to a second housing surface substantially opposite the first housing surface.

15. The apparatus of claim 13, wherein the second thermal barrier is at least 20 mm from the first thermal barrier.

16. The apparatus of claim 13, wherein the second thermal barrier is at least 30 mm from the processor and from the AC-DC power supply.

17. The apparatus of claim 13, further comprising a second temperature sensor, the second temperature sensor being on an opposite side of at least the second thermal barrier from the first temperature sensor.

18. The apparatus of claim 13, further comprising:

a housing having a set of power plug prongs extending from a rear surface thereof, the set of power plug prongs including a ground prong;

wherein the chamber is positioned in the housing such that ground prong is the nearest power plug prong to the chamber.

19. The apparatus of claim 18, wherein the first temperature sensor is at least 60 mm from the ground prong.

20. The apparatus of claim 18, wherein the processor is between the sensor chamber and the ground prong.

* * * * *